United States Patent
Stein (10) Patent No.: US 7,728,739 B2
(45) Date of Patent: Jun. 1, 2010

(54) ENTROPY CODEC WITH VARIABLE DIVISOR

(75) Inventor: Michael Victor Stein, San Jose, CA (US)

(73) Assignee: Apple Inc., Cupertino, CA (US)

(*) Notice: Subject to any disclaimer, the term of this patent is extended or adjusted under 35 U.S.C. 154(b) by 205 days.

(21) Appl. No.: 11/870,300

(22) Filed: Oct. 10, 2007

(65) Prior Publication Data

US 2009/0096642 A1    Apr. 16, 2009

(51) Int. Cl.
*H03M 7/30* (2006.01)
(52) U.S. Cl. .................. 341/51; 382/239; 375/240.02
(58) Field of Classification Search .............. 341/51, 341/67; 375/240.02; 382/239; 709/247
See application file for complete search history.

(56) References Cited

U.S. PATENT DOCUMENTS

| | | | | |
|---|---|---|---|---|
| 5,764,374 A * | 6/1998 | Seroussi et al. | ............. | 382/244 |
| 6,222,881 B1 * | 4/2001 | Walker | .................. | 375/240.03 |
| 6,272,180 B1 * | 8/2001 | Lei | ........................ | 375/240.16 |
| 6,356,663 B1 * | 3/2002 | Korta et al. | .................. | 382/239 |
| 6,549,676 B1 * | 4/2003 | Nakayama et al. | .......... | 382/246 |
| 7,492,820 B2 * | 2/2009 | Puri | ...................... | 375/240.03 |
| 7,580,585 B2 * | 8/2009 | Malvar | ...................... | 382/245 |
| 2007/0110151 A1 * | 5/2007 | Yu et al. | ................ | 375/240.03 |

FOREIGN PATENT DOCUMENTS

JP           08154229 A   *  6/1996

* cited by examiner

*Primary Examiner*—Howard Williams
(74) *Attorney, Agent, or Firm*—Fish & Richardson P.C.

(57) ABSTRACT

Data values are encoded for transmission to a recipient on a communication channel. Performance information associated with the encoding or the communication channel is obtained and used at least in part to determine quantization factors used in the encoding. The data values can be scaled based on the quantization factors and ordered based on a probability factor. A portion of the data values can be selected based on content. A code table can be selected based on a variation of the data values, where the code table specifies codewords including at least one of bits representative of a divisor, bits representative of a remainder, and a bit representative of a sign. Codewords can be generated for the data values using the code table. The encoded data values can be transmitted to a recipient where the data values are decoded using a decoder.

27 Claims, 8 Drawing Sheets

ENTROPY CODEC WITH VARIABLE DIVISOR

TECHNICAL FIELD

The subject matter of this patent application is generally related to digital signal processing.

BACKGROUND

Entropy encoding is a data compression scheme that assigns codes to symbols so as to match code lengths with the probabilities of the symbols. Typically, entropy encoders are used to compress data by replacing symbols represented by equal-length codes with symbols represented by codes where the length of each codeword is proportional to the negative logarithm of the probability. Therefore, the most common symbols use the shortest codes.

Two of the most common entropy encoding techniques are Huffman coding and arithmetic coding. If the approximate entropy characteristics of a data stream are known in advance, a simpler static code may be useful. These static codes include universal codes (e.g., Elias gamma coding, Fibonacci coding) and Golomb codes (e.g., unary coding, Rice coding).

Golomb coding uses a tunable parameter M to divide an input value N (e.g., a number to be encoded) into a quotient q and a remainder r. The quotient q can be sent to a decoder in unary coding, followed by the remainder r in truncated binary encoding or other variable-length binary encodings (e.g., arithmetic, Huffman encodings).

Rice coding is a special case of Golomb coding and is equivalent to Golomb coding where the tunable parameter M is a power of two. Thus Rice coding can be efficiently implemented on digital devices, since the division operation becomes a bitshift operation and the remainder operation becomes a bitmask operation. Rice coding is used as the entropy encoding stage in a number of lossless image compression and audio data compression methods.

Several techniques exist for selecting a tunable parameter M (i.e., the divisor) that works best for the data to be encoded. For example, one technique adjusts the value of the tunable parameter dynamically during encoding based on the data size. Such a technique, however, may not be optimal for the particular application for which the technique is being used. One example of such an application would be screen sharing in a video conferencing application where the shared screen is to be compressed and sent to a recipient. Such an application often has low bandwidth and fast screen changes which requires the compression coding of the shared screen to be fast and efficient.

SUMMARY

Data values are encoded for transmission to a recipient on a communication channel. Performance information associated with the encoding or the communication channel is obtained and used at least in part to determine quantization factors used in the encoding. The data values can be scaled based on the quantization factors and ordered based on a probability factor. A portion of the data values can be selected based on content. A code table can be selected based on a variation of the data values, where the code table specifies codewords including at least one of bits representative of a divisor, bits representative of a remainder, and a bit representative of a sign. Codewords can be generated for the data values using the code table. The encoded data values can be transmitted to a recipient where the data values are decoded using a decoder.

Other implementations are disclosed, including implementations directed to methods, systems and computer-readable mediums.

DETAILED DESCRIPTION

Figure 1A:
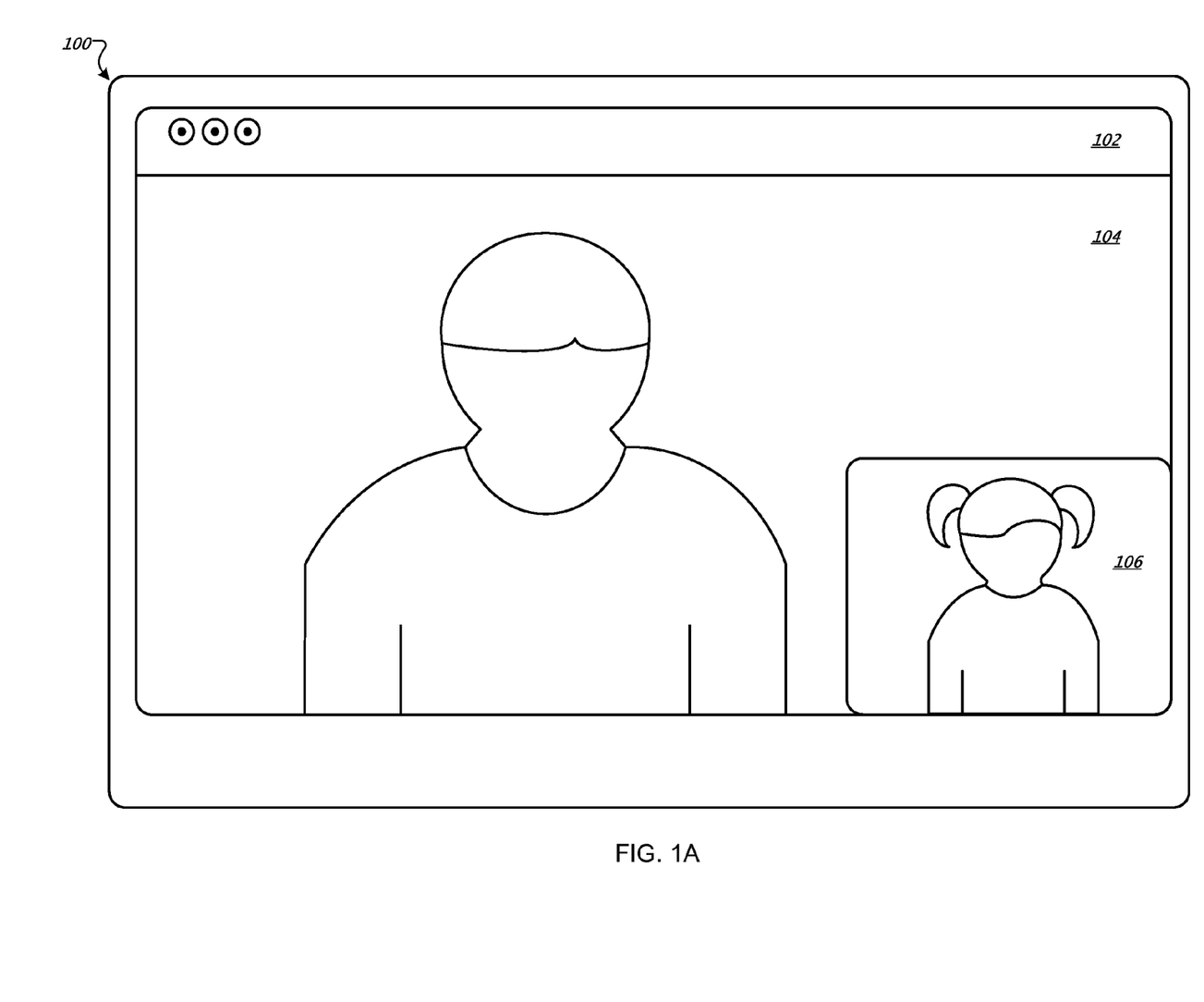
FIG. 1A illustrates a computer desktop of a user participating in a videoconference application.

FIG. 1A illustrates a computer desktop 100 of a user participating in a videoconference application. A computer desktop is the background area of a computer display screen, on which windows, icons, and other graphical user interface items can appear. A graphical user interface (GUI) is a user interface based on graphics (e.g., icons, pictures, menus, etc.) in contrast to a user interface based solely on text. The desktop 100 includes a videoconference window 102, which shows a videoconference session between the user's computer and a computer of a videoconference participant. The user of the desktop 100 will hereafter be referred to as the "content sender" or sender, other videoconference participants will hereafter be referred to as the "content recipients" or recipients. The videoconference window 102 includes a video area 104 for presenting a video representation of the content recipients to the user. The videoconference window 102 also includes a preview area 106 for presenting a video representation of the user. A user can use the preview area 106 to observe a representation of him or herself as would be seen by the content recipient. Similarly, a corresponding desktop of the content recipient can have a videoconference window, which includes a video area for presenting a video representation of the content sender. The content recipient's videoconference window can also have a preview area where the content recipient can observe a presentation of him or herself as would be seen by the content sender.

Figure 1B:
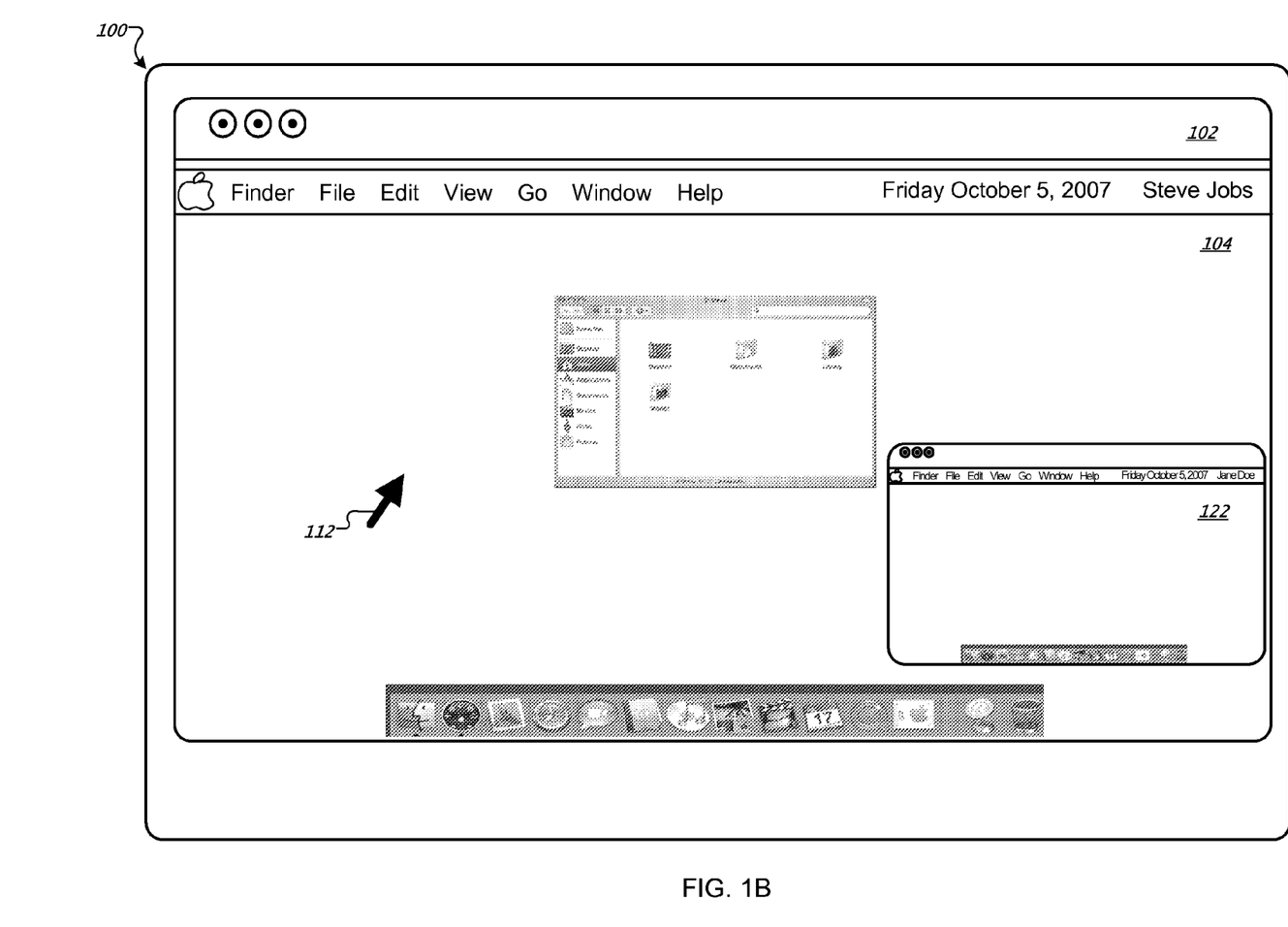
FIG. 1B illustrates a computer desktop of a user participating in a videoconference application where screen sharing is enabled.

FIG. 1B illustrates a computer desktop 120 of a user participating in a videoconference application where screen sharing is enabled. In the example of FIG. 1B, the videoconference can be between two users, a sender and a recipient, where the sender can allow the recipient to control their computer remotely. The recipient can view, in the video area 104, a screen representative of the sender's desktop. The recipient's screen can display a floating window 122, which shows the contents of their desktop. The sender and recipient can share this screen giving them the ability to interact with the displayed screen items. For example, the recipient can use controls available on their computer to navigate around and select items from the shared screen. An audio connection can be established between the sender's computer and the recipient's computer.

The ability to share a screen between two users can include updating the shared screen content based on input from either user. For example, as a user navigates the shared screen with their mouse pointer, various parts of the screen may be redrawn (e.g., a pop-up window may be displayed) or the entire screen may be redrawn (e.g., another application is launched). These screen updates can be displayed on the shared screen, which can require the shared screen to be updated on the sender's computer and data representative of the current screen can be transmitted to the recipient's computer for display, in a format recognizable by both computers. It is desired to have the screen update appear simultaneously to both users. In another example, the recipient may navigate the shared screen requiring the screen display data to be updated. The updated screen can be displayed on the shared screen on the recipient's computer and data representative of the display screen can be transmitted to the sender's computer.

A method can be implemented that can compress the image data of the shared screen in a timely and efficient manner in a common format recognizable by both the sender's computer and the recipient's computer. This compressed image data can be sent from the sender's computer to the recipient's computer or vice versa via the communications channel established between the computers on a communications network. Examples of communication networks can include, e.g., a LAN (Local Area Network), a WAN (Wide Area Network), and the computers and networks forming the Internet.

In an example sequential method of image compression, the image data can be broken up into tiles, 8 pixels wide by 8 pixels tall. Image data in each pixel can be converted from one color space to another (e.g., from RGB (red, green and blue image data) to YCbCr (a luma component (Y), and two chroma components (CbCr)). Each pixel in the 64 pixel tile can undergo a discrete cosine transform (DCT). The DCT of each of the 64 pixels in the tile can result in the representation of the image data in a spatial frequency spectrum. The amplitude of each of the frequency components can then be quantized. Quantization factors can be selected based on the desired image quality when viewing the reconstructed image. Since the human eye can be more sensitive to small variations in color or brightness over large areas than the actual strength of a high frequency brightness variation, the magnitude of the high frequency components of the pixel data can be stored with less accuracy than the low frequency components. This, as well as the overall size of the compressed image, can help determine the quantization factors (e.g., larger quantization factors can result in greater image compression but poorer reconstructed image quality).

The quantized coefficients of the image data can be ordered in increasing frequency, which can be referred to as a "zig-zag" order. The coefficients can then be entropy encoded. Entropy encoding is a lossless data compression procedure that assigns codes to symbols, where the code lengths match with the probability of the symbols (e.g., more frequently used symbols have shorter code lengths).

Each tile can include a DC coefficient, and AC coefficients that can be divided into two groups. The DC coefficient of each tile can represent the brightness or shading across the tile. One group of AC coefficients in a tile can be referred to as the middle frequency AC coefficients of the tile, which can represent the texture in an image. The other group of AC coefficients in a tile can be referred to as the high frequency AC coefficients, which can represent very fine details in an image. Each of the groups of AC coefficients, as well as the DC coefficient, can be uniquely coded. For example, the DC coefficient for one tile can be subtracted from the previous tile and the difference can be coded (a "backward" difference). Using backward difference coding can result in small numbers (many times the value may be zero) being encoded.

In some implementations, the luma component (Y) of a color-transformed pixel may be have its AC coefficients encoded and its DC coefficient compressed. In some implementations, the two chroma components (CbCr) of a color-transformed pixel may have its DC component compressed and none of its AC components encoded. The DC components in both implementations can be compressed in a similar manner. In some implementations, the image data used to create a screen image may include pixel information where the luma component (Y) of a pixel includes a compressed DC coefficient and encoded AC coefficients, and each chroma component of a pixel includes only a compressed DC coefficient.

Screen sharing can operate as a real time feature on a user's computer. If either user selects an action on the shared screen that requires updating of the screen, the update occurs in real time, for both users. Therefore, it is desirable for image data to be compressed, transmitted, and uncompressed as quickly as possible. In a system with variable, and often times limited, bandwidth, as well as frequent packet losses, it is also desirable to compress the image data into as small an amount as possible to decrease transmission time. However, a tradeoff can be made between image compression size and resolution. The ability to maintain image resolution yet decrease overall image data size may include the use of specialized compression processes.

The disclosed entropy encoding methods can be used in applications that use screen sharing between two devices or otherwise transmit digital images over communication channels.

Figure 2A:
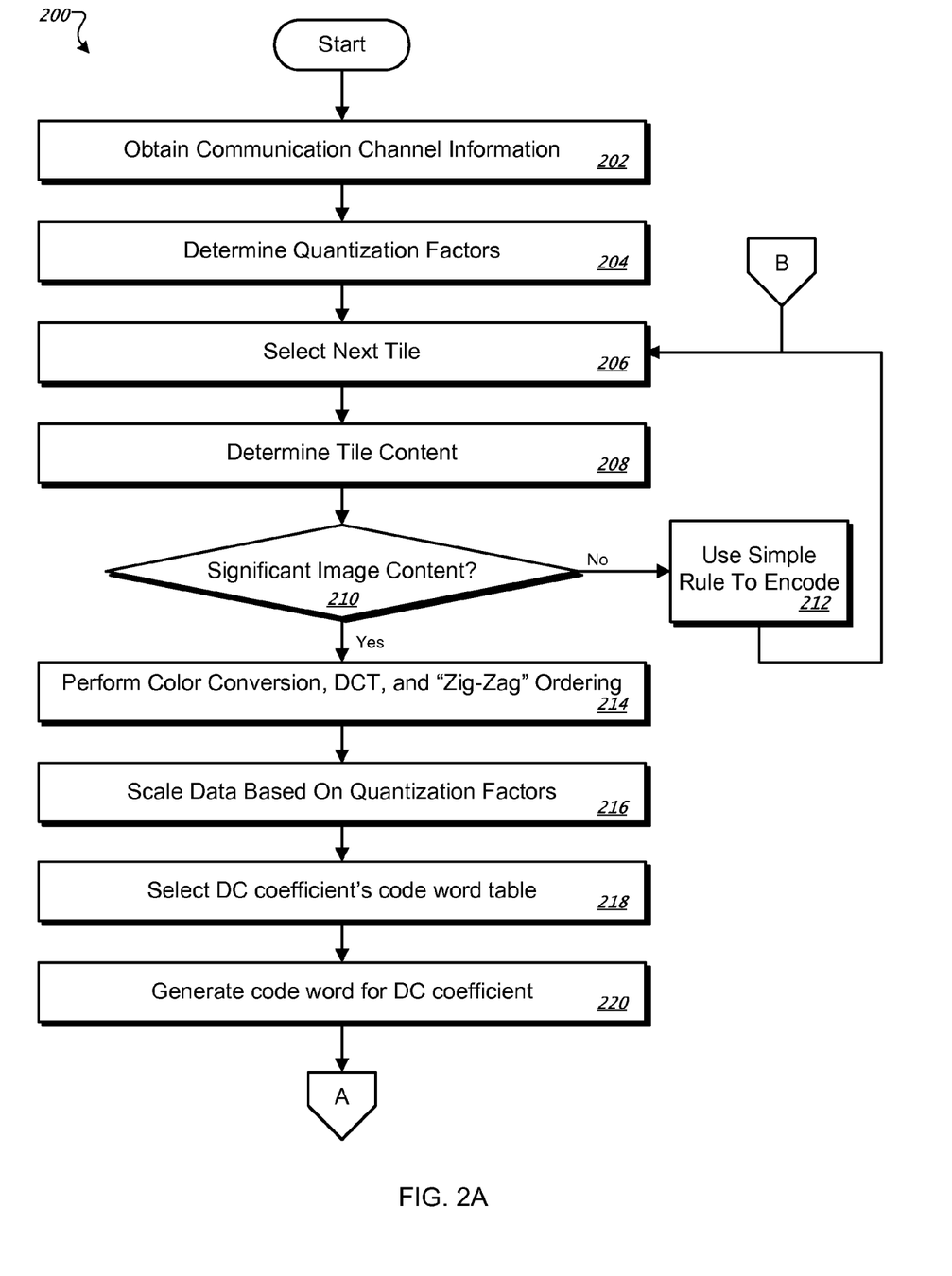
FIGS. 2A-2B are a flow diagram of an example image compression process with variable quantization factors, and optimized entropy encoding.
Figure 2B:
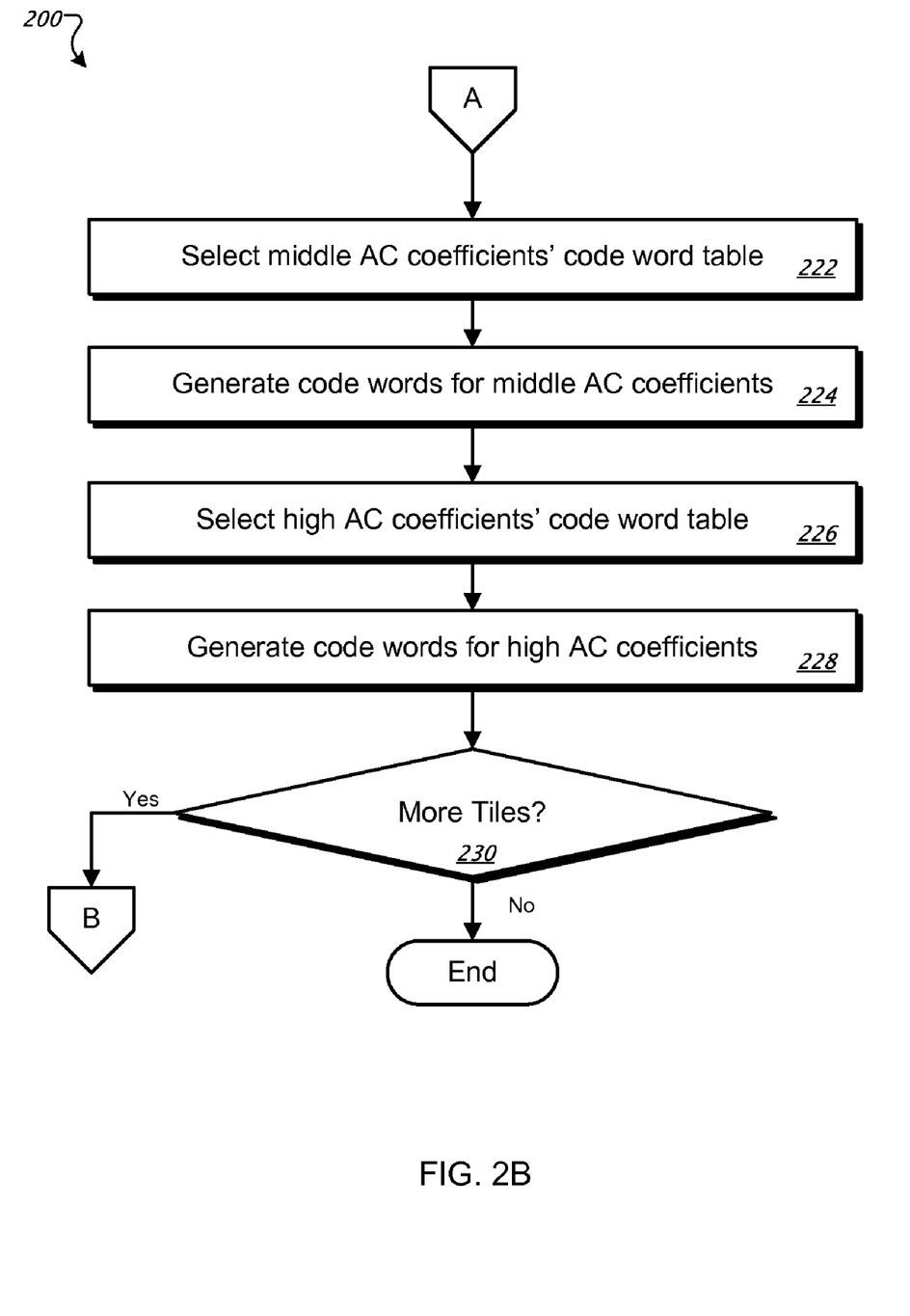

FIGS. 2A-2B are a flow diagram of an example image compression process 200 with variable quantization factors, and optimized entropy encoding. The process 200 can be used in a screen sharing application running on the sender's computer, or any other computer that may need to encode image data information in a timely and efficient manner. For example, with reference to FIG. 1B, the sender and recipient computers can be running a videoconference application. The videoconference application can control the videoconference by monitoring and controlling the communication channel between the sender's computer and the recipient's computer. Specifically, the videoconference application can determine, at any point in time, the available network resources, in terms of bandwidth, that can be used to send data from one computer to another. The bandwidth available can be a function of many factors including but not limited to, other network activity, transmission signal strengths, etc. Another factor in determining total data transmission speed can be packet loss. Packet losses require the resending of lost packets, increasing transmission time. The videoconference application may provide current packet loss information. It may be desirable to limit the amount of transmitted data based on available bandwidth and packet losses.

Prior to the start of process 200, the image data has been tiled as described with reference to FIG. 1B. The process 200 begins by obtaining information related to bandwidth and packet losses associated with a communication channel from an application (e.g., the videoconference application) (step 202). The application can have the ability to monitor and manage the communication channel, and provide information to other processes that may need to use and share the communication channel. The process 200 can determine quantization factors (step 204) to use on DCT coefficients of a dataset (e.g., the updated shared screen image data) based on the communication information.

The pixel values of each tile are examined, on a tile-by-tile basis, to determine general image content. Tiles that include variable data values can be representative of a portion of the screen image that is significant in content. Tiles that include similar or exact data values can be representative of a portion of the screen image that has little content (e.g., a tile that includes a solid background portion of the screen image). The tiles that are rich in content will be entropy encoded based upon the type of coefficient in the tile (e.g., DC coefficient, middle AC coefficients, high AC coefficients).

The process 200 continues by selecting an 8×8 pixel tile (step 206). The pixel values of the tile are examined and relative image content is determined (step 208). If it is determined that the tile includes significant image content (step 210) the tile can be entropy encoded. Tiles that are determined not to include significant image content (step 210) (e.g., tiles that may be single color, two colors, or black and white) can be encoded by a simple rule that can be matched to their data contents (step 212).

The process 200 can continue with a tile selected for entropy encoding by converting image data in each pixel from one color space to another, and transforming the tile using a DCT (step 214). The DCT coefficients in each tile can be scaled based on the selected quantization factors and the coefficients for each tile can be ordered based on increased frequency (the "zig-zag" order) (step 216). As described with reference to FIG. 1B, the image data in each tile can be represented by a DC coefficient, and AC coefficients. After quantization, this ordering can also be representative of decreased importance of data.

As was described with reference to FIG. 1B, the coefficients of the tile can include a DC coefficient, middle AC coefficients, and high AC coefficients. A DC coefficient can be encoded by selecting a code table to be used for the encoding of DC coefficients that specifies code words that can include bits representative of a divisor, bits representative of a remainder, and a bit representative of a sign (step 218). The code word for the DC coefficient can be generated (step 220). The middle AC coefficients can be encoded by selecting a first code table to be used for the encoding of middle AC coefficients that specifies code words that can include bits representative of a divisor, bits representative of a remainder, and a bit representative of a sign (step 222). The code words for the middle AC coefficients can be generated (step 224). The high AC coefficients can be encoded by selecting a second code table to be used for the encoding of high AC coefficients that specifies code words that can include bits representative of a divisor, bits representative of a remainder, and a bit representative of a sign (step 226). The code words for the high AC coefficients can be generated (step 228). The codewords for the middle and high AC coefficients can be self-delimited (e.g., separated by a zero value) for ease of decoding.

The process determines if there are more tiles in the image data to select (step 230). If there are more tiles, the next tile is selected (step 210), and the process 200 continues. If there are no more tiles left, the process 200 ends.

In some implementations, the code table for the different types of coefficients in a tile can be unique. In other implementations, one table may be used for all coefficient types, or a combination of tables may be used. In some implementations, tables may not be used at all and the code words can be determined on the fly by running code that can encode the pixel data. In some implementations, this code can be unique for each coefficient type. In other implementations, the code may be the same for all coefficient type or for more than one coefficient type.

Golomb-Rice coding can be an efficient entropy encoding and decoding process for lossless image compression and reconstruction. It can provide relatively fast encoding as it involves no division operations to compress the data, but instead uses a bitshift operation for the division and a bitmask operation to determine the remainder. It also can require little extra memory. It uses at least one bit per symbol encoded. Therefore, the encoding of zeros (high AC coefficients may include many zeros as well as backward difference DC coefficients) uses at least one bit. It also assumes that numbers whose values are larger are less probable than smaller numbers, which can be the case for DCT coefficients.

Additionally, the selection of an optimal divisor (tunable parameter M) can be difficult. For example, in order to determine the optimal value for M, all of the data to be encoded can be scanned. Multiple values of M can be tried on the data and the value that produces the best compression can be selected. In another example, different values for M can be determined and specified as side data. In another example, a value for M can be determined based on a previous value and the nature of the data.

In some implementations, the value of the divisor can vary depending on the dividend. The value of the divisor can be encoded in the resultant entropy encoded value. In some implementations, the determination of the variation of the divisor and the dividend can depend upon the data to be encoded. In some implementations, the value of the divisor can be selected such that smaller numbers are encoded with fewer bits, allowing them to be encoded closer to their optimal bit size. In some implementations, it can be advantageous to encode multiple zeros in a compressed format. For example, a bit sequence can be used to indicate the start of a series of zero coefficient values. The zero coefficients can be continually read until a non-zero coefficient is encountered. The block of zero coefficients can be encoded using a code word value for zero and a count indicating the number of consecutive zeros. A bit sequence can also be used to indicate the end of the block of data (e.g., 64 pixel values of an 8×8 pixel tile).

In some implementations, the value of the divisor can be unary coded, using a value of "1", in the most significant bits of the encoded coefficient (e.g., a divisor of 4 is "11", a divisor of 8 is "111"). The remainder can be binary coded in the encoded coefficient, and may have a known constant value added to or subtracted from it before it is represented in its binary form. A "0" bit separates the unary coded divisor from the binary coded remainder. The least significant bit of the entropy encoded value can be a sign bit (e.g., a value of "1" indicates a negative number).

The entropy encoded values for each coefficient can be calculated inline by executing a process or retrieved from a stored lookup table. The determination of inline code processing verses the use of a look up table can be made based on efficiency (speed vs. memory usage). The decoding algorithms can be matched to the encoding algorithms. (e.g., they use the same code rules or the same tables).

The determination of the value of the divisor per dividend can be varied dependent upon which coefficients are being encoded. In some implementations three different variations can be used: one for encoding the DC coefficients, one for encoding the middle frequency AC coefficients and another for encoding the high frequency AC coefficients. Each variant "fine tunes" the value of M for each dividend dependent upon the type of data to be encoded. For example, the high frequency AC coefficients can have a higher probability of smaller numbers since higher divisors are used in the quantization matrix for these coefficients. For example, the encoded representation of the value 2 may include 4 bits when encoding the high AC coefficients and the encoded representation of the value 2 may include 5 bits when encoding the middle AC coefficients. Non-linear entropy encoding of the coefficients of a tile can occur, where the non-linearity can be "fine tuned" based upon the coefficients to be encoded.

Figure 3A:
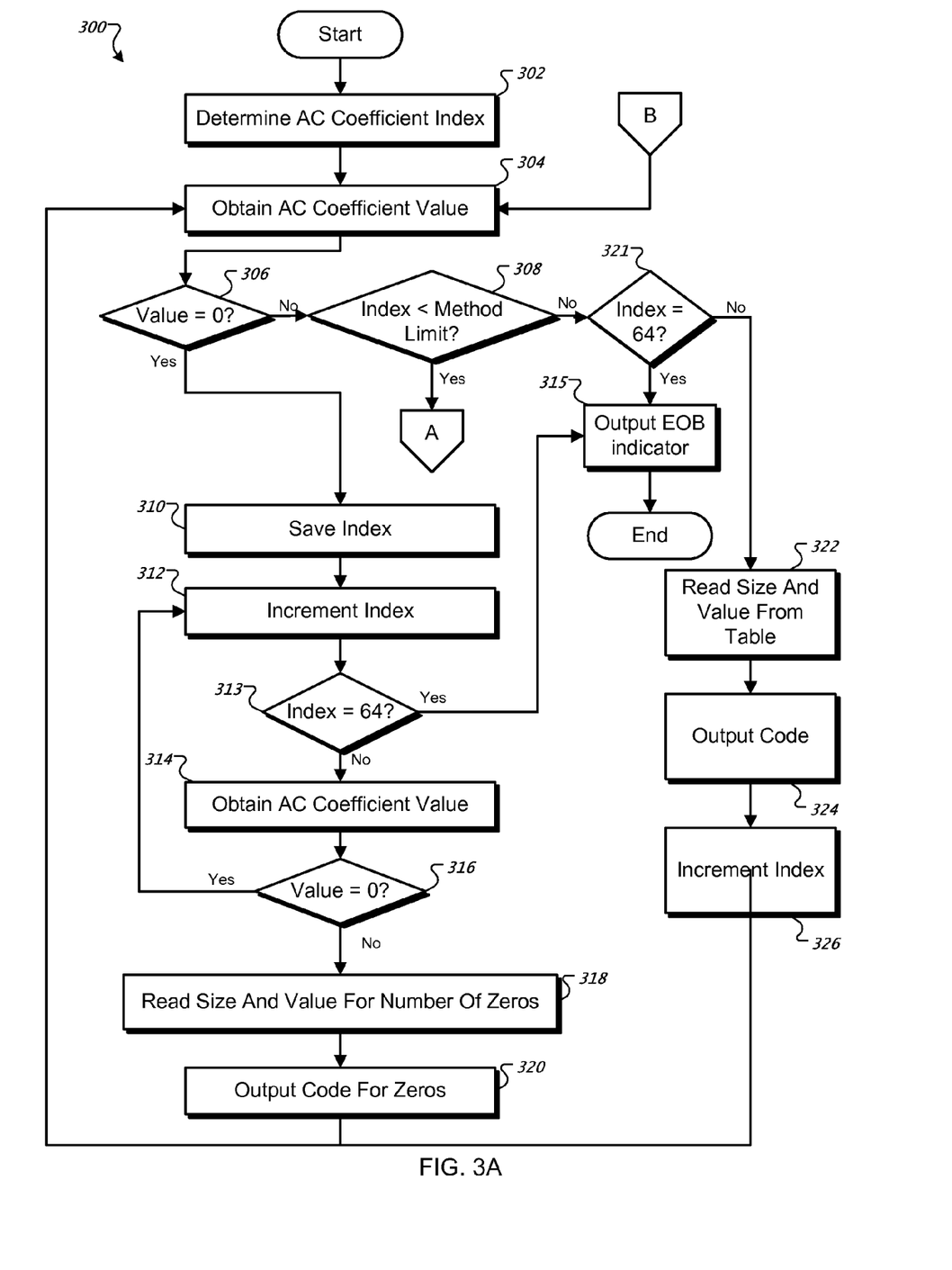
FIGS. 3A-3B are a flow diagram of an example entropy encoding process for a coefficient.
Figure 3B:
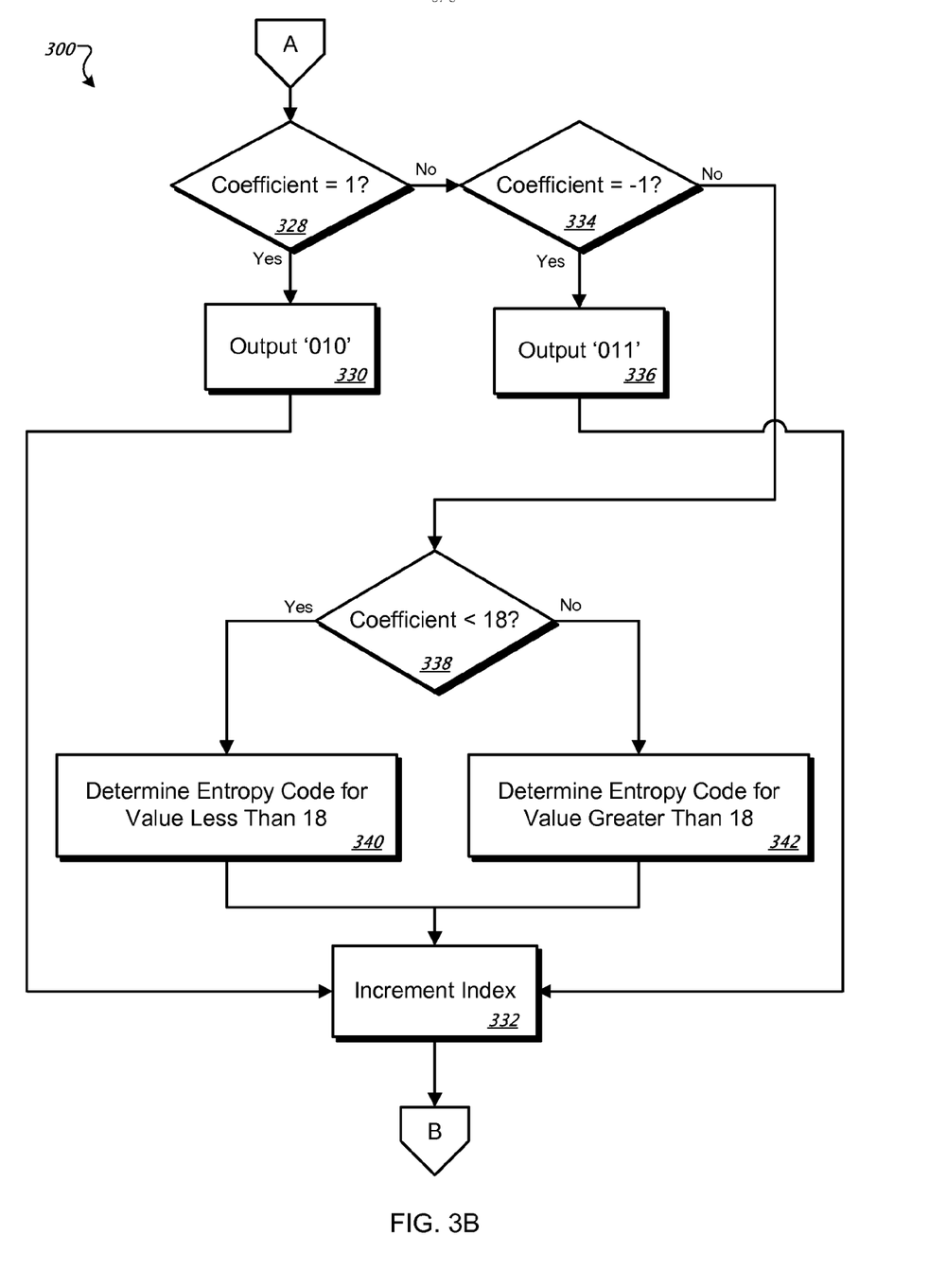

FIGS. 3A-3B are a flow diagram of an example entropy encoding process for a coefficient. The process 300 can be performed on an 8×8 pixel image tile. The process 300 begins by setting the starting index for the AC coefficients equal to one (step 302). The AC coefficient can be obtained (step 304). The AC coefficients at the start of the image tile may include more image information due to the "zig-zag" representation of the data. These AC coefficients can be referred to as middle AC coefficients. These coefficients can be encoded differently than the high AC coefficients, where the encoding method is "fine tuned" to accommodate the use of larger numbers for data. We can refer to the encoding method for these coefficients as Method A. Method B can refer to the encoding method for the high AC coefficients. A method limit can be a value that indicates where the change in encoding method occurs as the image tile data values are encoded. For example, the method limit can be set equal to 6, as is shown in the pseudo-code listed below.

The value of the AC coefficient is compared to zero (306). If equal, the index is saved (step 310), and then incremented (step 312). If the index does not equal 64 (step 313), the next AC coefficient value can be obtained (step 314). If the newly obtained value is equal to zero, the index is incremented (step 312). This can continue until an AC coefficient is obtained that does not equal zero (step 316), or until the index is equal to 64 (step 313).

If the index is equal to 64 (step 313), a value (e.g., '0010') can be output indicating the end of the block of data (e.g., 8×8 tile) has been reached (step 315). The process 300 ends. If the value of the AC coefficient is not equal to zero (step 316), the number of zeros obtained and the encoded value for the zeros can be determined (step 318) and then if the value of the AC coefficient is not equal to zero (step 316), the number of zeros obtained and the encoded value for the zeros can be determined (step 318) and then output (step 320).

The process 300 continues by obtaining the next AC coefficient (step 304). The value of the AC coefficient is compared to zero (306). If it is not equal to zero, the index is checked against the method limit (step 308) and if it is less than the method limit, continuing to FIG. 3B, the AC coefficient is checked (step 328) and if it is equal to "1", the encoded value of '010' is output (step 330), and the index is incremented (step 332). The process 300 can continue by obtaining the next AC coefficient (304).

If the AC coefficient is not equal to "1", the process 300 checks if the AC coefficient is equal to "−1" (step 334). If yes, the encoded value of '011' is output (step 336) and the index is incremented (step 332). The process 300 can continue by obtaining the next AC coefficient (step 304).

If the AC coefficient is not equal to "−1" (step 334), the coefficient is checked to see if it is less than 18 (step 338). If yes, the entropy code for the AC coefficient is determined using the encoding algorithm for a value that is less than 18 (step 340). The pseudo-code shown below is an example of compression code for generating the encoded value for the AC coefficient. Table 1 is a table of encoded entropy values per AC coefficient value that can be produced by the compression code. The index is incremented (step 332) and the process 300 can continue by obtaining the next AC coefficient (step 304).

If the AC coefficient is not less than 18 (step 338), the entropy code for the AC coefficient is determined using the encoding algorithm for a value that is greater than 18 (step 342). The pseudo-code shown below is an example of how the encoded value for the AC coefficient can be determined. The index is incremented (step 332) and the process 300 can continue by obtaining the next AC coefficient (step 304).

The process 300 continues by checking the index against the method limit (step 306) and if it is greater than the method limit, it is checked again to see if it is equal to 64 (step 321). If it is not equal to 64, the size and value of the encoded code word are obtained from a look up table (step 322) and then output (step 324). An example of a look up table of AC coefficients verses encoded pixel values is shown in Table 2. The index is incremented (step 326) and the AC coefficient can be obtained (step 304). If the value of the index is equal to 64 (step 321), an end of block (EOB) is identified and can be encoded as '0010'. The process 300 ends.

In some implementations, a group of consecutive bit values may represent the same encoded values in multiple encoding schemes. For example, the value "00" may always be the encoded value of '0', "010" may always be the encoded value of '1', "011" may always be the encoded value of '−1'. In some implementations, a group of consecutive bit values may represent a unique condition, and may always be encoded with the same value in multiple encoding schemes. For example, the value "0010" may represent the end of a block of data. The value "0011" may represent the start of multiple zero coefficient values. In these implementations, the encoded values common across encoding schemes may be located in the most significant bits of the encoded value, with the MSB equal to '0'. Since the encoding scheme uses bit values of '1' to encode the value of the divisor, a MSB value of '0' can indicate the special conditions.

The following is example pseudo-code for the process of FIGS. 3A-3B.

```
EncodeAC( )
{
  index = 1;
// when to switch over to methodB - right now hardcoded to coefficient
  index 6 set value of methodALimit ;
  do
  {
    Coefficient = the next coefficient to encode
    if ( Coefficient == 0 )
    {
      startIndex = index;
      do
        increment Index
      while (next coefficient == 0 ) and ( index < 64 )
      //   loop til find non zeros or end of block
      if index == 64,        // if zeros to end of block
        output '0010'
      else
      {
        read size and value for (index − startIndex) zeros from
          table
        output the code for (index − startIndex) zeros
      }
    }
    else if index < methodALimit )
    {
    // could make a table, but this encoding method is just using a few
    // different divisors, so reasonable to implement it in code
      if ( Coefficient == 1 )
        output '010'
      else if ( ( Coefficient == −1 )
        output '011'
      {
        Convert Coefficient to positive number;
```

-continued

```
if ( Coefficient < 18 )
{
    // the dividend
    oneBitCount = (Coefficient −2 ) / 4 ) ;
    output oneBitCount 1 bits;       // 11...
    remainingBitValue = 0x10 + (coefficient −2 ) & 3)<< 1;
    V// 10XXX
    if ( coefficient was negative )
        remainingBitValue = remainingBitValue + 1;
    // lowest bit is the sign bit
    output lower 5 bits of remainingBitValue;
}
else
{
    // the dividend
    oneBitCount = (Coefficient −18 ) / 8;
    output oneBitCount 1 bits;       // 11...
    remainingBitValue = 0x3e0 + (((coefficient−18) &
        7)<<1)
    if ( coefficient was negative )
        remainingBitValue = remainingBitValue + 1;
    // lowest bit is the sign bit
    output lower 10 bits of remainingBitValue;
}
}
else // Method B
{
    //the other compression method is a bit more complex, so
    //simpler to just make a table for the range of values we want to
    // encode
    Read size and value from table;
    Output the code for this Coefficient
}
increment index;
} while (index < 64 )
}
```

TABLE 1

| AC Coefficient | Encoded entropy value |
| --- | --- |
| 0 | 00 |
| 1 | 010 |
| −1 | 011 |
| 2 | 10000 |
| −2 | 10001 |
| 3 | 10010 |
| −3 | 10011 |
| 4 | 10100 |
| −4 | 10101 |
| 5 | 10110 |
| −5 | 10111 |
| 6 | 110000 |
| −6 | 110001 |
| 7 | 110010 |
| −7 | 110011 |
| 8 | 110100 |
| −8 | 110101 |
| 9 | 110110 |
| −9 | 110111 |
| 10 | 1110000 |
| −10 | 1110001 |
| 11 | 1110010 |
| −11 | 1110011 |
| 12 | 1110100 |
| −12 | 1110101 |
| 13 | 1110110 |
| −13 | 1110111 |
| 14 | 11110000 |
| −14 | 11110001 |
| 15 | 11110010 |
| −15 | 11110011 |
| 16 | 11110100 |
| −16 | 11110101 |
| 17 | 11110110 |
| 17 | 11110111 |

TABLE 2

| AC Coefficient | Encoded entropy value |
| --- | --- |
| 0 | 000 |
| 1 | 010 |
| −1 | 011 |
| 2 | 1000 |
| −2 | 1001 |
| 3 | 1010 |
| −3 | 1011 |
| 4 | 110000 |
| −4 | 110001 |
| 5 | 110010 |
| −5 | 110011 |
| 6 | 110100 |
| −6 | 110101 |
| 7 | 110110 |
| −7 | 110111 |
| 8 | 11100000 |
| −8 | 11100001 |
| 9 | 11100010 |
| −9 | 11100011 |
| 10 | 11100100 |
| −10 | 11100101 |
| 11 | 11100110 |
| −11 | 11100111 |
| 12 | 11101000 |
| −12 | 11101001 |
| 13 | 11101010 |
| −13 | 11101100 |
| 14 | 11101100 |
| −14 | 11101101 |
| 15 | 11101110 |
| −15 | 11101111 |
| 16 | 111100000 |
| −16 | 111100001 |
| 17 | 111100010 |
| 17 | 111100011 |

In the implementation of process 300, the DC coefficient of a tile can be encoded using the same process as Method B (use of a look up table). The DC coefficients can be the difference factor from the previous DC coefficient. Therefore, DC coefficients can be small numbers, and in many cases can be equal to zero. Therefore, the encoding of the DC coefficient can use the same look up tables as the high AC coefficients (which also tend to be small numbers). However, in some implementations, the value of zero for DC coefficient encoding can be equal to '00' as opposed to '000' which is the value used for encoding the high AC coefficients.

The following is an example of pseudo-code for encoding the DC coefficient:

```
EncodeDC( dcValue )
{
    // the DC coefficient can be encoded using the same method as
    // Method B, except that zero, is encoded as '00'
    if ( ! dcValue )
        output '00'
    else
    {
        Convert dcValue to positive number;
        read size and value from same table used in Method B;
        if (dcValue was negative)
            increment value;
        output value;
    }
}
```

Figure 4:
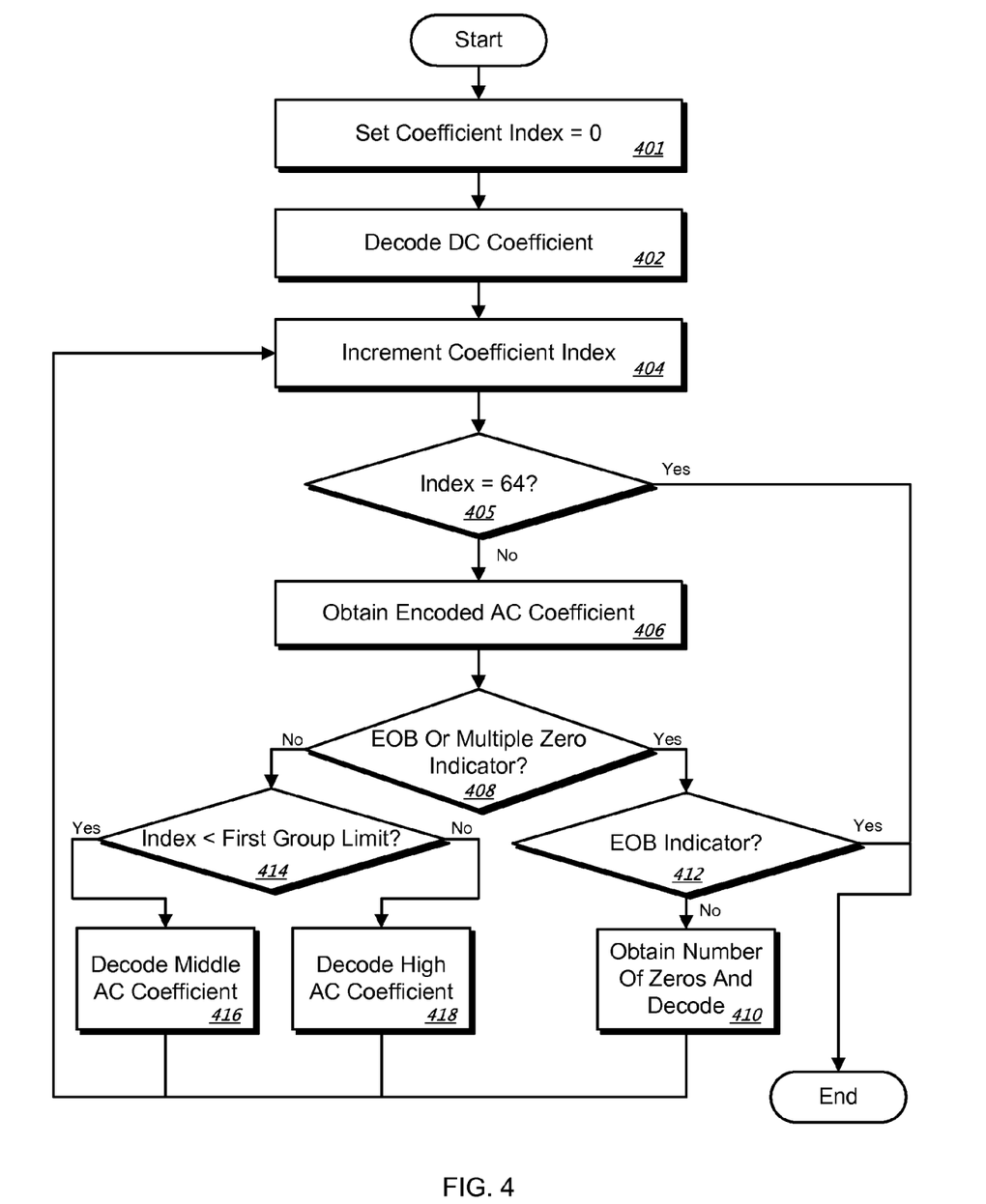
FIG. 4 is a flow diagram of an example entropy decoding process for a coefficient.

FIG. 4 is a flow diagram of an example entropy decoding process 400 for a coefficient. The process starts by setting the coefficient index equal to zero (step 401). Next, the DC coefficient is decoded (step 402). The decoded value of the DC coefficient can be determined by using a look up table, an example of which is Table 2. The AC coefficients can be decoded next. The coefficient index is incremented (step 404) to point to the first AC coefficient. The index is checked to determine if it is equal to 64 (step 405). If the index is not equal to 64, the encoded AC coefficient value is obtained (step 406). If the index is equal to 64, the process 400 ends. Next, it is determined if the encoded AC coefficient value is equal to an EOB (end of block) or multiple zero indicator (step 408). If yes, it is then determined if the encoded AC coefficient value is an EOB indicator (step 412). If yes, the process 400 ends.

If the encoded AC coefficient value is not an EOB indicator (step 412), then it is a multiple zero indicator, which indicates the start of a block of multiple zeros. The number of zeros is obtained and the zero values are decoded (step 410). The index is incremented (step 404) and the process 400 continues.

A first group limit is set equal to the value used for the method limit of the encoding process. The first group limit is a value indicating at what index value the AC coefficients transition from middle AC coefficients to high AC coefficients. AC coefficients whose index value is less than the first group limit were encoded using Method A, and AC coefficients whose value is greater than the first group limit were encoded using Method B. Therefore, the decoding process 400 may need to have prior knowledge of this parameter to determine which decoding algorithm to use on the entropy encoded data.

If the encoded AC coefficient does not indicate multiple zeros or an end of block (step 408), the value of the index is compared to the first group limit (step 414). If the index is less than the first group limit, a middle AC coefficient, that was encoded using Method A, is decoded using a decoding algorithm based on the Method A encoding (step 416). Pseudo code for this algorithm will be described below.

If the index is not less than the first group limit (step 414), a high AC coefficient, that was encoded using Method B, is decoded using a decoding algorithm based on the Method B encoding (step 418). Pseudo code for this algorithm will be described below. The index is incremented (step 404). If the index is not equal to 64 (step 405) another encoded AC Coefficient is decoded. The process 400 can continue until the index is equal to 64 (step 405) or an end of block indicator is encountered (step 412).

In general, the decoding process can include reading an encoded value from the MSB to the LSB. Algorithms for implementing the process read the number of "1" bits starting at the MSB until a zero bit is encountered. The number of "1" bits can indicate the value of the divisor used in the encoding process. For example, two one bits, '11' can represent a divisor equal to 4, and three one bits, '111', can represent a divisor equal to eight. Once the zero bit is reached, dependent on the encoding scheme used, a predetermined number of bits after the "0" bit are the remainder. In some implementations, two bits may be used to encode the value of the remainder. In other implementations, three bits may be used to encode the value of the remainder. The last bit or least significant bit is the sign bit where a value of "1" indicates a negative number.

If the most significant bit of the encoded value is a "0" then the encoded value is a special case. For example, '0010' can indicate the end of a block of data and '0011' can indicate the start of a multiple block of zeros.

The following is an example of pseudo-code for decoding entropy encoded data.

```
//   decoder side for a DCT block (in this case 8 by 8 pixels)
Zero the destination array.
DecodeDCDelta( );         // determine the value of the DC coefficient
firstGroupLimit = 6       // this value should equal the methodALimit
do
{
    Read next bit into variable FirstBit;
    if ( FirstBit == 0 )
    {
        index = ReadZerosAndOnes( index )
    }
    else
    {
        Count the number of 1 bits that are next in the buffer;
        if ( count of 1 bits < 5 )
        {
            //   use dividend of 4. Read in the remainder (2 bits)
            //   plus a sign bit
            read in next 3 bits into Remainder
            nextCoefficient = ( 4 * ( count of 1 bits -1 )) *
                ( Remainder >> 1) + 2;
        }
        else
        {
            //   use dividend of 8. Read in the remainder ( 3 bits)
            //   plus a sign bit
            nextCoefficient = (8 * (count of 1 bits − 5)) + (junk2 >>1 )+ 18;
        }
        if ( remainder & 1 )     //   if sign bit is set
            nextCoefficient = 0 − nextCoefficient;
        dest[ index ] = remainder;
        index++;
    }
} while (index < firstGroupLimit )
// second group has high quantization so uses an algorithm that
//          assumes lower numbers have higher probability
while ( index < 64 )
{
    Read next bit into variable FirstBit;
    if ( FirstBit == 0 )
    {
        index = ReadZerosAndOnes( index )
    }
    else
    {
        Count the number of 1 bits that are in the buffer;
        if ( 1 == oneBitCount )
        {
            //    10XX
            //   Read the value and the sign bit
            //   Possible coefficients = 2,−2,3,−3
            Read next 2 bits into variable remainder;
            nextCoefficient = (remainder >> 1 ) + 2;
        }
        else if ( 2 == oneBitCount )
        {
            //    110XXX
            //   Read the value and the sign bit
            //   Possible coefficients = 4,−4,5,−5,6,−6,7,−7
            Read next 3 bits into variable remainder;
            nextCoefficient = (remainder >> 1 ) + 4;
        }
        else
        {
            //   N 1 bits followed by a zero followed by 3 bits
            //   remainder and then a sign bit
            //   with 3 one bits, range is
            //      8,−8,9,−9,10,−10,11,−11,12,−12.13,−13,14,−14,15,−15
            //   with 4 one bits range is
            //      16,−16,17,−17,18,−18,19,−19,20,−20,21,−21,22,
                −22,23,−23
            //   etc
            // Read the remainder and the sign bit
            Read next 4 bits into variable remainder;
            nextCoefficient = (8 * (oneBitCount−2)) + (remainder >>1 );
        }
```

```
        if ( remainder & 1 )
            nextCoefficient = -nextCoefficient;
        dest[ index ] = nextCoefficient;
        ++index;
    }
}
ReadZerosAndOnes( index )
{
    Read next 2 bits into cmd;
    if ( cmd == 0 )
    {
        //   next coefficient is zero.
        index++;
    }
    else if ( cmd == 1 )
    {
        Read next bit into cmd2
        if ( cmd2 == 0 )
        {
            // 0010 = end of block
            index = 64
        }
        else
            index += MultipleZeroCount( );   //   0011 indicates
                                             // a run of zeros. What
                                             // follows is the number
                                             // of zero coefficients
    }
    else if ( cmd == 2 )
    {
        //  010 == 1
        dest[ index] = 1;
        index++;
    }
    else if ( cmd == 3 )
    {
        //    011 = -1
        dest[ index ] = -1;
        index++;
    }
    return index;
}
int MultipleZeroCount( )
{
    // 1 zero coefficient are encoded as the bit pattern 000
    // 2 zero coefficients are encoded as 000000
    // 3 - 5 zero coefficients are encoded as 001100, 001101, 001110
    // 6-12 zero coefficients are encoded as 001111XXX
    // 13-19 zero coefficients are encoded as 001111111XXX
    //    etc.
    Read first 2 bits into FirstVal;
    zeroCount = 3 + FirstVal;
    if ( FirstVal == 3 )
    {
        do
        {
            Read next 3 bits into NextVal
            zeroCount += nextVal;
        } while ( nextVal == 7 && (zeroCount + i < 64) );
    }
    return zeroCount;
}
DecodeDCDelta( )
{
    Count the number of 1 bits that are in the buffer;
    if ( oneBitCount == 0 )
    {
        Read next bit into cmd2
        if ( cmd2 == 0 )
        {
            // 00
            dc = 0;
        }
        else
        {
            // 01X or -1
            Read next bit into cmd2
            dc = 1
        }
    }
    else if ( 1 == oneBitCount )
    {
        Read next 2 bits into cmd2
        dc = (cmd2 >> 1 ) + 2;
    }
    else if ( 2 == oneBitCount )
    {
        Read next 3 bits into cmd2
        dc = ( cmd2 >> 1 ) + 4;
    }
    else
    {
        Read next 4 bits into cmd2
        dc = (8 * (oneBitCount-3)) + (cmd2 >>1 );
    }
    if ( cmd2 & 1 )
    {
        dc = -dc;
    }
    return dc
}
```

Figure 5:
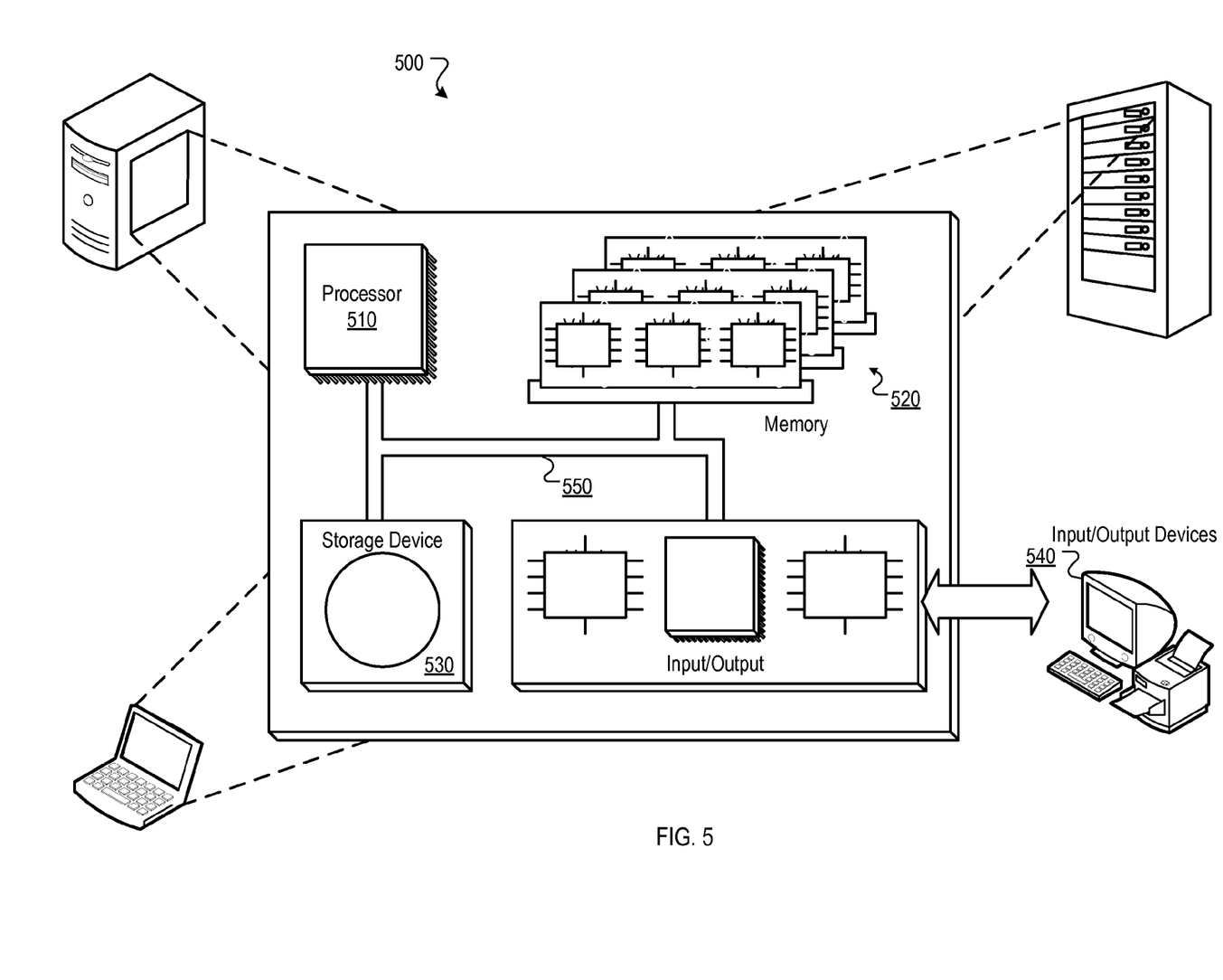
FIG. 5 is a block diagram of an example system architecture for implementing the features and operations described in reference to FIGS. 1A, 1B, 2A, 2B, 3A, 3B, 4.

FIG. 5 is a block diagram of an implementation of a system for implementing the processes of FIGS. 2A-2B, 3A, 3B, and 4. For example, the system 500 may be included in the sender or recipient computers, described with reference to FIGS. 1A-1B. The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. In some implementations, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In some implementations, the memory 520 is a computer-readable medium. In another implementation, the memory 520 is a volatile memory unit. In yet another implementation, the memory 520 is a non-volatile memory unit.

The storage device 530 is capable of providing mass storage for the system 500. In some implementations, the storage device 530 is a computer-readable medium. In various different implementations, the storage device 530 may be a floppy disk device, a hard disk device, an optical disk device, or a tape device.

The input/output device 540 provides input/output operations for the system 500. In some implementations, the input/output device 540 includes a keyboard and/or pointing device. In another implementation, the input/output device 540 includes a display unit for displaying graphical user interfaces.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network. The relationship of client and server arises by virtue of computer programs running on the respective computers and having a client-server relationship to each other.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of encoding data for transmission on a communication channel, comprising:
   obtaining performance information associated with the encoding method or the communication channel;
   determining quantization factors based at least in part on the performance information;
   scaling a set of data based on the quantization factors;
   ordering the data based on a probability factor;
   selecting a portion of the ordered data to be encoded based on content;
   selecting one or more code tables based on a variation of the ordered data, where the one or more code tables specify at least one divisor and at least one remainder, the divisor determined by one or more coefficient frequencies; and
   generating encoded values of the data using the code tables, wherein the method is performed using one or more computers.

2. The method of claim 1, where the performance information includes traffic information associated with the communication channel or bandwidth information associated with a system implementing the encoding method.

3. The method of claim 1, where:
   the data include one or more first coefficients having a first frequency and one or more second coefficients having a second frequency, the first frequency distinct from the second frequency;
   the first and second coefficients are used in a compression process and the coefficient frequencies include the first and second frequency.

4. The method of claim 3, where compression process is based on a Discrete Cosine Transform (DCT).

5. The method of claim 4, where the first and second coefficients are DCT coefficients that are associated with a block of data, and a block indicator associated with the coefficients is encoded using a predetermined number of bits.

6. The method of claim 4, where coefficients having zero values are coded using a separate process than used to code coefficients with non-zero values.

7. The method of claim 3, where:
   the code tables include a first code table corresponding to the first coefficients and a second code table corresponding to the second coefficients, the second code table distinct from the first code table;
   the divisor is determined by the frequency of the corresponding coefficients; and
   the remainder is a variable-length remainder calculated using a corresponding coefficient and the divisor.

8. The method of claim 1, where the encoded values of the data are self-delimited.

9. The method of claim 1, where the communication channel is associated with a video conferencing application.

10. The method of claim 9, further comprising:
    transmitting the encoded values to a recipient over the communication channel as an update to encoded data previously transmitted to the recipient.

11. The method of claim 1, where the probability factor is increased frequency.

12. The method of claim 1, where the code tables are generated on the data to be encoded, a variation of the data, and a specified encoding algorithm.

13. The method of claim 1, where the divisor and remainder are represented by one or more codewords.

14. The method of claim 13, where the codewords include a sign.

15. A method of decoding data, comprising:
    obtaining a set of data values, data values ordered using an index;
    obtaining a first group limit value;
    for each data value of at least a portion of the set of data values, determining if its corresponding index value exceeds the first group limit value;

if the first group limit value is exceeded, decoding the data value using a first decoding method, including referencing a first lookup table; and if the first group limit value is not exceeded, decoding the data value using a second decoding method, including referencing a second lookup table, the first and second lookup tables populated by values calculated using a variable divisor determined by one or more coefficient frequencies, wherein the method is performed using one or more computers.

16. A system for encoding data for transmission on a communication channel, comprising:

a processor; and memory coupled to the processor and operable for storing instructions, which, when executed by the processor, causes the processor to perform operations comprising:

obtaining performance information associated with an encoding method or the communication channel;

determining quantization factors based at least in part on the performance information;

scaling a set of data based on the quantization factors;

ordering the data based on a probability factor;

selecting a portion of the ordered data to be encoded based on content;

selecting one or more code tables based on a variation of the ordered data, where the one or more code tables specify at least one divisor, and at least one remainder, the divisor determined by one or more coefficient frequencies; and generating encoded values of the data using the code tables.

17. The system of claim 16, where the performance information includes traffic information associated with the communication channel or bandwidth information associated with a system implementing the encoding method.

18. The system of claim 16, where:

the data include one or more first coefficients having a first frequency and one or more second coefficients having a second frequency, the first frequency distinct from the second frequency;

the first and second coefficients are used in a compression process and the coefficient frequencies include the first and second frequency.

19. The system of claim 18, where compression process is based on a Discrete Cosine Transform (DCT).

20. The system of claim 19, where the first and second coefficients are DCT coefficients that are associated with a block of data and a block indicator associated with the coefficients is encoded using a predetermined number of bits.

21. The system of claim 19, the operations further comprising:

transmitting the encoded values to a recipient over the communication channel as an update to encoded data previously transmitted to the recipient.

22. The system of claim 18, where:

the code tables include a first code table corresponding to the first coefficients and a second code table corresponding to the second coefficients, the second code table distinct from the first code table;

the code tables are generated based on the data to be encoded, a variation of the data, and a specified encoding algorithm;

the divisor is determined by the frequency of the corresponding coefficients; and the remainder is a variable-length remainder calculated using a corresponding coefficient and the divisor.

23. The system of claim 16, where the probability factor is increased frequency.

24. A computer-readable medium having instructions stored thereon, which, when executed by a processor, causes the processor to perform operations comprising:

obtaining performance information associated with an encoding method or a communication channel;

determining quantization factors based at least in part on the performance information;

scaling a set of data based on the quantization factors;

ordering the data based on a probability factor;

selecting a portion of the ordered data to be encoded based on content;

selecting one or more code tables based on a variation of the ordered data, where the code tables specify at least one divisor and at least one remainder, the divisor determined by one or more coefficient frequencies; and generating encoded values of the data using the code tables.

25. The computer-readable medium of claim 24, where:

the data include one or more first coefficients having a first frequency and one or more second coefficients having a second frequency, the first frequency distinct from the second frequency;

the first and second coefficients are used in a compression process; and the coefficient frequencies include the first and second frequency.

26. The computer-readable medium of claim 25, where:

the first and second coefficients are Discrete Cosine Transform (DCT) coefficients that are associated with a block of data and a block indicator associated with the coefficients is encoded using a predetermined number of bits;

the encoded values are generated based on the data to be encoded, a variation of the data, and a specified encoding algorithm;

the code tables include a first code table corresponding to the first coefficients and a second code table corresponding to the second coefficients, the second code table distinct from the first code table;

the divisor is determined by the frequency of the corresponding coefficients; and the remainder is variable-length remainder calculated using a corresponding coefficient and the divisor.

27. A system for decoding data, comprising:

a processor; and a memory coupled to the processor and operable for storing instructions, which, when executed by the processor, causes the processor to perform operations comprising:

obtaining a set of data values, where the data values are ordered using an index;

obtaining a first group limit value;

for each data value of at least a portion of the set of data values, determining if its corresponding index value exceeds the first group limit value;

if the first group limit value is exceeded, decoding the data value using a first decoding method, including referencing a first lookup table; and if the first group limit value is not exceeded, decoding the data value using a second decoding method, including referencing a second lookup table, the first and second lookup tables populated by values calculated a variable divisor determined by one or more coefficient frequencies.

* * * * *

UNITED STATES PATENT AND TRADEMARK OFFICE
CERTIFICATE OF CORRECTION

| | | |
|---|---|---|
| PATENT NO. | : 7,728,739 B2 | Page 1 of 1 |
| APPLICATION NO. | : 11/870300 | |
| DATED | : June 1, 2010 | |
| INVENTOR(S) | : Michael Victor Stein | |

It is certified that error appears in the above-identified patent and that said Letters Patent is hereby corrected as shown below:

In column 16, lines 22-23, in Claim 3, delete "process and the coefficient frequencies include the first and second frequency." and
 insert -- process; and
the coefficient frequencies include the first and second frequency. --, therefor.

In column 16, line 54, in Claim 12, delete "generated on" and insert -- generated based on --, therefor.

In column 16, line 62, in Claim 15, delete "values, data" and insert -- values, the data --, therefor.

In column 17, line 27, in Claim 16, delete "divisor," and insert -- divisor --, therefor.

In column 17, line 42, in Claim 18, delete "process" and insert -- process; --, therefor.

Signed and Sealed this
First Day of November, 2011

David J. Kappos
*Director of the United States Patent and Trademark Office*